United States Patent [19]
Newman

[11] Patent Number: 5,128,643
[45] Date of Patent: Jul. 7, 1992

[54] METHOD AND APPARATUS FOR PRODUCING A REGION OF LOW MAGNETIC FIELD

[76] Inventor: David E. Newman, P.O. Box 3333, Ste. 244, Encinitas, Calif. 92024

[21] Appl. No.: 587,107

[22] Filed: Sep. 24, 1990

[51] Int. Cl.⁵ .............................................. H01F 7/00
[52] U.S. Cl. ..................... 335/301; 335/304; 324/318
[58] Field of Search .............. 335/211, 214, 301, 304; 324/318, 319, 320

[56] References Cited

U.S. PATENT DOCUMENTS

| | | | |
|---|---|---|---|
| 3,466,499 | 9/1969 | Beth | 315/85 |
| 3,801,877 | 4/1974 | Griese | 317/157.5 |
| 4,058,782 | 11/1977 | Förster | 335/219 |
| 4,152,745 | 5/1979 | Eul | 361/146 |
| 4,233,583 | 11/1980 | Novacek | 335/236 |
| 4,646,045 | 2/1987 | Chari | 335/301 |
| 4,646,046 | 2/1987 | Vavrek | 335/301 |
| 4,647,887 | 3/1987 | Leupold | 335/211 |
| 4,658,228 | 4/1987 | Leupold | 335/211 |
| 4,758,812 | 7/1988 | Forster et al. | 335/301 |
| 4,806,894 | 2/1989 | Koto | 335/214 |
| 4,808,957 | 2/1989 | Furukawa | 335/301 |
| 4,849,727 | 7/1989 | Sasaki | 335/301 |

*Primary Examiner*—George Harris

[57] ABSTRACT

A magnetic shield is presented comprising a shell of ferromagnetic material, augmented by one or more shielding magnets. The shielding magnets may be permanent magnets, electromagnetic coils, or other sources of magnetic flux. These shielding magnets are placed in close proximity to the shell, on the surface facing the region to be shielded, and are arranged to cancel any magnetic flux penetrating through the ferromagnetic shell into the region to be shielded. This invention provides magnetic protection for an exterior region when the shield is assembled around a magnet whose external field is to be contained, such as an MRI magnet. This invention also provides protection within an interior volume which is to be protected from an exterior source such as the Earth's magnetic field. The method by which the invention is applied is an iterative one, in which the shielding magnets are applied to substantially cancel the leakage field and then adjusted to minimize the remaining field in the shielded region. The invention is expected to be useful in containing the fringing field of medical imaging magnets as well as other applications.

15 Claims, 3 Drawing Sheets

METHOD AND APPARATUS FOR PRODUCING A REGION OF LOW MAGNETIC FIELD

FIELD OF INVENTION

This invention relates to magnetic fields, and more particularly to devices that shield regions of space from magnetic fields, and methods of producing such devices.

BACKGROUND OF THE INVENTION

Magnetic fields are useful in modern technology. For example, Magnetic Resonance Imaging (MRI) systems produce medical diagnostic images, and nuclear magnetic resonance (NMR) systems are increasingly useful for chemical analysis. Such systems employ large high-field magnets.

Many large magnets generate external fields which can interfere with the operation of instruments in the vicinity, as well as produce personnel hazards. For example, cathode ray tube displays commonly used with computers are distorted by fields as low as 0.6 Gauss. People wearing cardiac pacemakers are at risk when exposed to magnetic fields of intensities that could interfere with a cardiac device. Also, strong magnetic field gradients can attract and accelerate nearby ferromagnetic objects, creating personnel hazards.

Magnetic shields are used to contain the external fringe fields of large magnets. For example, magnetic shields contain the external field of MRI magnets when computer displays are used in the vicinity. Magnetic shields are also used to produce an internal region of low magnetic field. For example, electron microscopes and photomultiplier tubes generally use magnetic shields for protection from ambient magnetic fields.

The most popular form of magnetic shield is a shell, or enclosure, made of steel or other material with high magnetic permeability. MRI magnets, for example, are often installed within room-sized steel enclosures to contain the far field. Another version of MRI magnet has a steel flux-return cage built directly onto the magnet case. Magnetic shields of this type are extremely heavy and costly. The cost of such a shield may be comparable to the cost of the MRI magnet. The cost of any reinforcement needed in the building in which it is to be installed can also be high. A magnetic shield providing equal field attenuation with less material and lower construction costs would thus be desirable.

Present magnetic shields, such as those built around MRI magnets, generally reduce the fringing field to about 1 to 2 Gauss near the shield. This field is too high for most color displays to be used without severe color distortion. The effectiveness of the shields is therefore limited. It is not feasible to reduce the fringing field to the desired level of 0.5 Gauss by making the shield thicker because this would require many more tons of steel. In addition, most or all of the openings that are normally built into a shield would have to be closed with more ferromagnetic material in order to achieve 0.5 Gauss. Many shield applications would not be feasible without access to the interior volume through these openings. A new type of shield providing improved effectiveness while retaining the openings in the shield is therefore needed.

An additional problem of conventional shields has to do with the Earth's magnetic field. Any large volume of ferromagnetic material, such as a room-sized MRI shield, collects and focuses the ambient field of the Earth, producing local flux concentrations at the edges of the shield. Such flux concentrations may be large enough to distort computer displays. This effect is not eliminated by use of more ferromagnetic material in the shield, nor by use of material of higher magnetic permeability.

The weight, cost, and limited effectiveness of these systems have prompted other attempted solutions. MRI magnets have been built with two coaxial coils, the outer coil having opposite polarity from that of the inner coil and powered so as to cancel the far field. The nested coil approach succeeds in reducing the weight of the system relative to the weight of a steel-enclosed system, but at considerable extra expense due to the increased number of turns of conductor and the increased cooling requirements. Also, the central field of the two coils partially cancel, resulting in reduced performance of the MRI system.

The magnetic shielding problem has no generally acceptable solution, as shown by the design of mobile MRI systems, which are typically left unshielded. Consequently, the surrounding area is cordoned off, requiring large areas to be inaccessible for general use.

Common to all prior ferromagnetic shields is the leakage of flux into the shielded region. This penetration of magnetic field is due partly to the finite permeability of the material, and partly to the penetration of magnetic flux through various openings which are usually necessary in the shield.

A region of low magnetic field can be created by use of an array of electromagnets, oriented and powered so as to cancel the ambient field. Such an array may be practical for small scale application, but in dealing with high fields and large spatial volumes, sufficient coils would have to be so large and would consume so much electrical power that they would not be practical.

An array of permanent magnets may also be used to cancel the ambient magnetic field within a specified region. For large scale applications, this approach becomes impractical because of the cost of the permanent magnet material and because of the large magnetic forces between portions of the material.

Magnetic shields can be produced using superconducting foils. Certain superconductors, known as Type I superconductors, expel magnetic fields. Regions of low field can be created by cooling such foils below their superconducting transition temperature while in a folded configuration, and then opening the foils out to form a bag-like shape whose boundary, being the superconductor, prevents field penetration. Unfortunately, the shield must be maintained at a low temperature, of the order of a few degrees Kelvin, which is incompatible with most applications.

A new magnetic shield is needed, characterized by higher effectiveness, lower weight, and lower cost than conventional ferromagnetic shells, greater practicality than arrays of electromagnetic coils or permanent magnets, and requiring no cryogenic cooling. The shield should further avoid focusing the ambient magnetic field or other features incompatible with common applications.

SUMMARY OF THE INVENTION

In accordance with the present invention, a new magnetic shield has been developed which overcomes the above difficulties. The invention consists of a shell comprised of ferromagnetic material, combined with one or more shielding magnets which cooperate with the shell to produce the desired region of low field. The shielding magnets may be permanently magnetized material, electromagnets comprised of electroconductive material, or any other source of magnetic flux. The purpose of these shielding magnets is to produce a field in the region to be shielded which cancels any field present from other sources, thus providing a low field region in the area desired.

The cooperation between the shell and the shielding magnets is obtained by placing the shielding magnets on the surfaces of the shell nearest to the region to be shielded. If the region to be shielded is interior to the shell, then the shielding magnets are placed on the inside surface of the shell. If the region to be shielded is exterior to the shell, then the shielding magnets are placed on the outside surface of the shell. The shielding magnets are arranged so that the ferromagnetic material of the shell will provide a low-reluctance return path for the flux of the shielding magnets, thus effectively amplifying the strength of the shielding magnets relative to their effect if the shell were absent.

The inventive magnetic shield may be used surrounding a source of magnetic field in order to contain its fringe field, thus providing a region of low magnetic field exterior to the shell. Alternatively, the invention can be used to protect an interior region from an external source of magnetic field.

The method by which the invention is operated consists of the following steps: The shell is assembled to form a boundary separating the region to be shielded from the source or sources of magnetic field that the region is to be shielded from. The magnetic field is then measured in the region to be shielded, and one or more shielding magnets are placed in close proximity to the shell so as to cancel this measured magnetic field to a desired level.

The shielding magnets of the invention may be adjusted by any means that changes the magnetic field generated by the shielding magnets in the region to be shielded. For example, the current and location of current-carrying conductors are adjustable in the case of electromagnets. For permanent magnets, the magnetization, location, and direction of orientation of the magnetized material are adjustable.

A major advantage of this invention is that it uses less steel or other shielding material than conventional shields. Since the field in the ferromagnetic material of conventional shields is usually well below the saturation flux density, the material is not being used to maximum advantage. The invention improves this by forcing more flux into the shell by means of coils or permanent magnets, thus producing a given field attenuation with less ferromagnetic material.

Another advantage of the invention is its greater effectiveness, as measured by field attenuation, than that provided by conventional shields. The magnets in the invention can be arranged to cancel the leakage flux as precisely as desired. The field in the protected region could, in principle, be reduced to zero by this method. The invention can thus achieve a higher level of shielding than any conventional shield.

Another advantage of the invention is that it can easily be arranged to cancel the Earth's field in the vicinity, thus preventing the prior problem of magnetic flux concentration at exterior corners of the shield.

Another advantage of the invention is lower cost. Steel is expensive, and construction of steel enclosures around MRI magnets requires expensive labor, and the foundation of the building must generally be reinforced to withstand the increased weight of the shield. The invention, on the other hand, makes more efficient use of the ferromagnetic materials and requires only the relatively inexpensive shielding magnets to control the field, thus reducing the weight and the cost of the system.

To summarize the advantages of the invention, it provides a level of magnetic shielding unmatchable by a purely ferromagnetic shield, it provides this improved performance with lower cost and weight, and it allows the problem of focusing of the Earth's field to be overcome. Relative to electromagnetic or permanent magnet arrays aimed at producing a low-field region, the invention provides a high level of shielding with less electrical power (in the case of electromagnetic coils) and with less permanent magnet material (in the case of magnetized systems).

Other features and advantages of the present invention will become more apparent from the following detailed description, taken in conjunction with the accompanying drawings, which illustrate by way of example, the principles of the invention.

BRIEF DESCRIPTION OF THE DRAWINGS

The accompanying drawings illustrate the invention. In such drawings.

DETAILED DESCRIPTION OF THE PREFERRED EMBODIMENT

Figure 1:
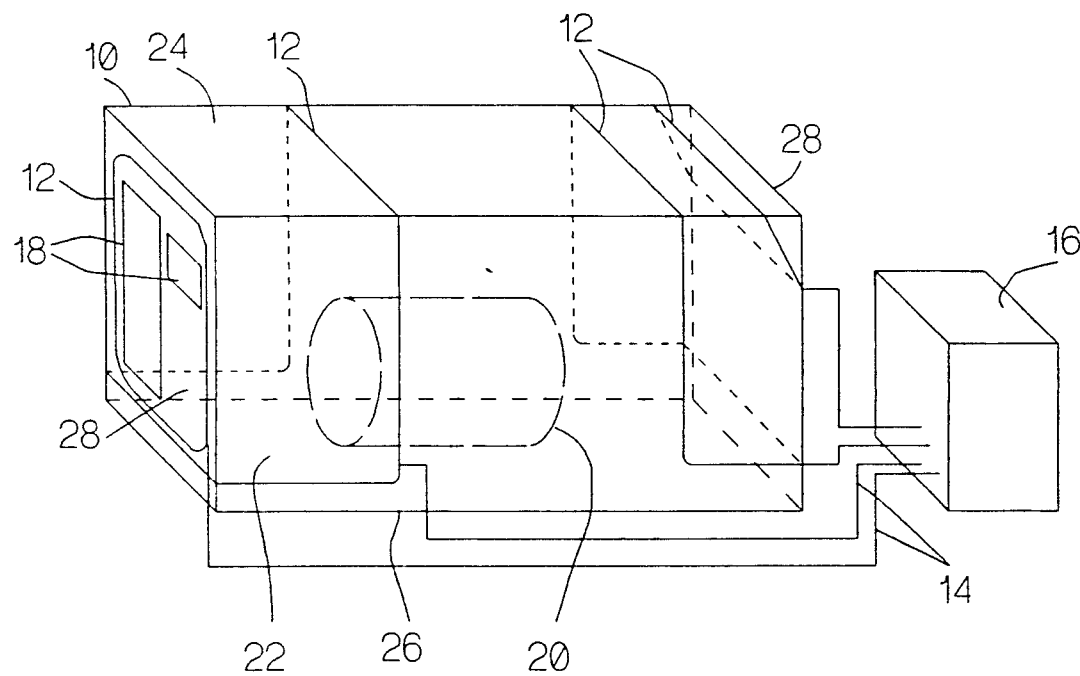
FIG. 1 is a perspective view, partly in phantom outline, of a shielding apparatus embodying the invention, adapted to the application of containing the magnetic field of an MRI magnet.

As shown in FIG. 1, the elements of a magnetic shield according to the invention are a shell 10, coils 12, leads 14, and a power supply 16. The region to be shielded is exterior to the shell 10. This embodiment is adapted to the application of shielding the fringing field of an MRI magnet 20 (shown in phantom outline).

Shell 10 is an enclosure, comprised principally of a ferromagnetic material, and surrounding the MRI magnet 20. Side walls 22, a ceiling 24, and floor 26 of the shell 10 are substantially parallel to the longitudinal axis of the MRI magnet 20, and ends 28 of the shell 10 are substantially perpendicular to the longitudinal axis of the MRI magnet. The shell 10 may be assembled from steel plates or other magnetically permeable material, and is of sufficient thickness that it can transport the flux from the MRI magnet 20 without saturating. Apertures 18 are provided in the shell 10 to allow patient access to the MRI magnet 20.

Coils 12 are placed on the surface of the shell 10 nearest to the region to be shielded. In this case, the region is the exterior, and thus the coils 12 are placed on the exterior of shell 10. While four such coils are illustrated in FIG. 1, the number of coils needed to produce the desired level of shielding will be determined by the distribution and characteristics of the magnetic field in the exterior region. The coils 12 are comprised of one or more turns of electroconductive material, which in this embodiment is insulated copper wire, of sufficient conductor size to carry the current from the power supply 16. The coils 12 are positioned around the shell 10 to generate a magnetic flux that cancels any flux that leaks from within the shell 10 as well as the concentration of any exterior fields at the corners of the shell 10. In this embodiment, it was assumed that the coils 12 could not be wound underneath the shell 10. Therefore, the coils 12 are shown wound over the ceiling 24, down the walls 22, and around the ends 28 of the shell 10.

The coils 12 are connected to each other and to the power supply 16 using leads 14, which in this embodiment are copper wires similar to those comprising the coils 12. The leads 14 are soldered or otherwise connected electrically to the ends of the wires of the coils 12 to place the coils 12 in series electrically, so that all of the coils 12 are powered simultaneously by the power supply 16.

The power supply 16 is a source of electrical current. In this embodiment, the power supply 16 is an adjustable, current-regulated, DC power supply with sufficient voltage and current ratings to create, in cooperation with the coils 12, sufficient magnetic fields external to the shell 10 to cancel the fringing magnetic fields thereabout.

The magnetic field external to the shell 10 is the sum of the field contributions coming from three magnetic sources, which are the MRI magnet 20, the electromagnetic coils 12, and any other sources external to the shell 10 including the Earth's naturally occurring magnetic field. The field from each of these sources is modified by the ferromagnetic shell 10 due to the well-known interaction between magnetic fields and ferromagnetic materials.

The contribution to the external field from the MRI magnet 20 is determined by the flux generated by the MRI magnet 20, the distance from the magnet 20 to the surfaces of the shell 10, the thickness and permeability of the ferromagnetic material of the shell 10, and by any apertures 18 in the shell 10.

The contribution to the external field from the ambient field, due to sources external to the shield 10, such as the Earth's field, is determined by the strength of the ambient field and by the focusing effect of the high-permeability material of the shell 10.

The contribution to the external field from the coils 12 is determined by the current flow, numbers of turns, and positions of the coils 12.

To disclose the operation of the invention more clearly, an elementary explanation of magnetic field principles is provided henceforth. The magnetic field generated by the flow of current, and in the absence of ferromagnetic material, is given by the law of Biot and Savart, which is:

$$dB = I(dl \times X)/(c|X|^3) \tag{1}$$

Here, dB is the incremental magnetic field contribution, due to the current I flowing in incremental length dl of conductor. The point at which the field is given by this formula is point X, and c represents the speed of light, and all units are standard CGS units. Quantities dB, dl, and X are vectors, the symbol x represents the cross product, and the symbol $|X|$ represents the magnitude of the vector X. The fields generated by currents in the coils 12 are obtained by adding up the incremental contributions from all of the coils 12.

A more convenient formula may be used to approximate the field in the vicinity of a long, straight set of conductors such as the generally straight sections of the coils 12. This formula is:

$$|B| = 2NI/(cR) \tag{2}$$

Here $|B|$ is the magnitude of the magnetic field at a point a distance R from an infinitesimally thin and infinitely long bundle of N conductors each carrying current I. This formula is obtained by integration of Eq. 1. The direction of the field is perpendicular to the plane formed by the conductor and the point at which the field $|B|$ is measured.

A planar, circular coil produces a magnetic field along its axis given by the following equation:

$$|B| = 2\pi NIa^2/(c(a^2+z^2)^{1.5}) \tag{3}$$

Here N is the number of turns, $\pi$ is approximately 3.14159, a is the radius of the coil, and z is the distance from the center of the coil to the point of measurement.

A ferromagnetic material placed in close proximity to the current carrier of Eq. 2 becomes magnetized. The direction and magnitude of this magnetization are such as to increase the strength of the magnetic field $|B|$ calculated from Eq. 2 in the region exterior to the ferromagnetic material. For the purposes of designing a magnetic shield according to the invention, the external magnetic field from a generally straight section of coil 12 in close proximity to the shell 10 is approximately twice the value given in Eq. 2 to account for the magnetization of the ferromagnetic material. Similarly, the field generated by the circular coil of Eq. 3 will be approximately doubled when the coil is placed against the ferromagnetic shell 10.

The theoretical basis for the use of permanent magnets is well known. Briefly, each permanent magnet produces a magnetic field which is approximately the same as that produced by an imaginary coil. The imaginary coil has the same area as the permanent magnet, measured perpendicular to the direction of magnetization, and has current flowing in it. The current in the imaginary coil is proportional to the length of the permanent magnet in a direction parallel to its magnetization, and to its coercive force, commonly referred to as $H_c$. When placed in close proximity to a ferromagnetic surface, the magnetic field generated in the space around the permanent magnet is approximately twice as large as for a permanent magnet which is not close to a ferromagnetic object.

The method for producing the magnetic shield shown in the embodiment of FIG. 1 includes the following steps: The shell 10 is constructed around the site of the MRI magnet 20. The magnetic field distribution is then measured exterior to the shell 10, in the region to be shielded. The amount of current needed to generate a magnetic field equal to that observed in the exterior region is then calculated using Eq. 2. Coils 12 are then wound with a sufficient number of turns and with sufficient current-carrying capacity to produce a field equal and opposite to the measured field in the region to be shielded. The incremental field generated by each coil 12 is proportional to the product of the number of turns times the current flowing in each wire. It is a matter of design convenience whether a large number of turns are used with relatively low current, or few turns at high current, the product being unaffected.

The coils 12 are then placed in close proximity to the outer surface of the shell 10. The coils 12 are placed substantially perpendicular to the longitudinal axis of the MRI magnet 20, and are approximately evenly spaced over the shell 10. The coils 12 are then connected electrically to the power supply 16 and to each other through the leads 14. In use, the MRI magnet 20 is powered at its operational field level, and current is applied to the coils 12. The direction of the current in coils 12 is selected to be generally opposite to the current flow direction exhibited in the MRI magnet 20 around its longitudinal axis. In this way, the external magnetic field of the coils 12 will tend to cancel the external field of the MRI magnet 20. The shield is then adjusted by alternately measuring the remaining field in the region to be shielded, and varying the current or position of the coils 12 until the desired level of field cancellation is achieved.

In the practice of this invention it may be convenient to use a computer program to simulate the magnetic field produced by the planned arrangement. Suitable non-linear, multi-dimensional simulation programs are in common use and are in the public domain.

In cooperation, the coils 12 and the shell 10 result in the elimination of the concentration of any ambient fields in the vicinity, such as the Earth's field, as well as canceling the leakage field of the MRI magnet 20.

Figure 2:
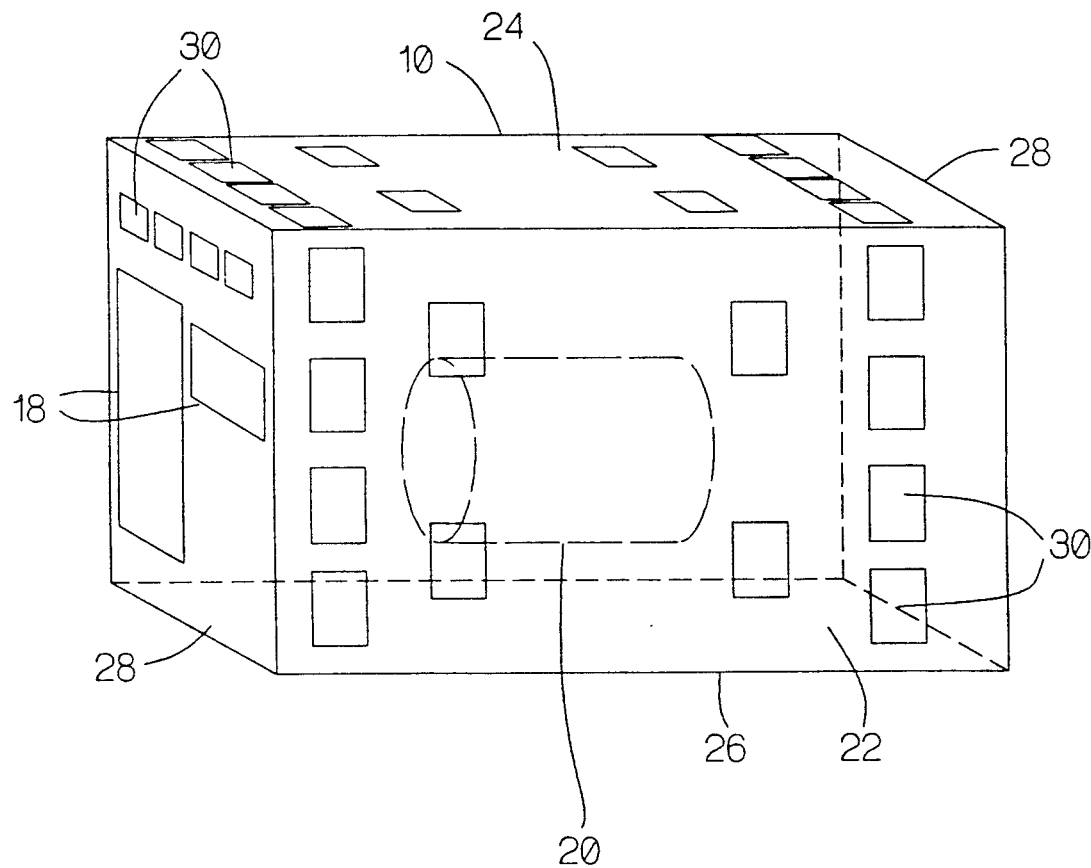
FIG. 2 is a perspective view, also partly in phantom outline, showing an embodiment of the invention using permanent magnets.

FIG. 2 shows an alternative embodiment of the invention. In this embodiment, permanent magnets 30 are placed around and in close proximity to the shell 10 so as to produce an exterior magnetic field equal and opposite to the fringe field created by the MRI magnet 20. The return flux from the permanent magnets 30 is carried by the ferromagnetic material of the shell 10.

The method for practicing the invention as depicted in FIG. 2 is as follows: A shell 10 of ferromagnetic material is placed around the MRI magnet 20. The magnetic field distribution exterior to the shell 10 is then measured. Permanent magnets 30 are placed on the exterior of the shell 10, so as to produce a magnetic field equal and opposite to the field from all other sources in the region exterior of the shell 10, the incremental field from the permanent magnets being estimated using the magnetic field formulas described in the theoretical section hereinabove. The remaining magnetic field in the region to be shielded is then measured and the permanent magnets 30 are adjusted in alternation until the desired level of shielding is achieved. The permanent magnets 30 may be adjusted by changing their number, their position on the surface of the shell 10, their orientation relative to the shell 10, and their degree of magnetization.

While the embodiments described mention coils 12 and permanent magnets 30 separately, it will be recognized that the invention could comprise both permanent magnets 30 and coils 12 together, or any other sources of magnetic field, each arranged on shell 10 to cancel the leakage field in the region to be shielded.

The invention is equally applicable whether the region to be shielded is interior or exterior to the shell 10. To prepare a shield for production of a region of low magnetic field in the interior of the shell 10, magnets such as electromagnetic coils or permanent magnets are placed inside the shell 10 so as to cancel the leakage field therein.

In testing of the invention, two magnetic shields were constructed, one using coils similar to those disclosed with reference to FIG. 1, and the other using permanent magnets similar to those disclosed with reference to FIG. 2. Both shields were constructed to produce a region of low magnetic field exterior to the shell, with a source of magnetic field inside the shell simulating an MRI magnet. Both devices were adjusted according to the method disclosed with their respective descriptions. Each shielding arrangement successfully reduced the magnetic field to the desired level of 0.5 Gauss, thus verifying the validity of the apparatus and method of this invention for producing a region of low magnetic field.

Figure 3:
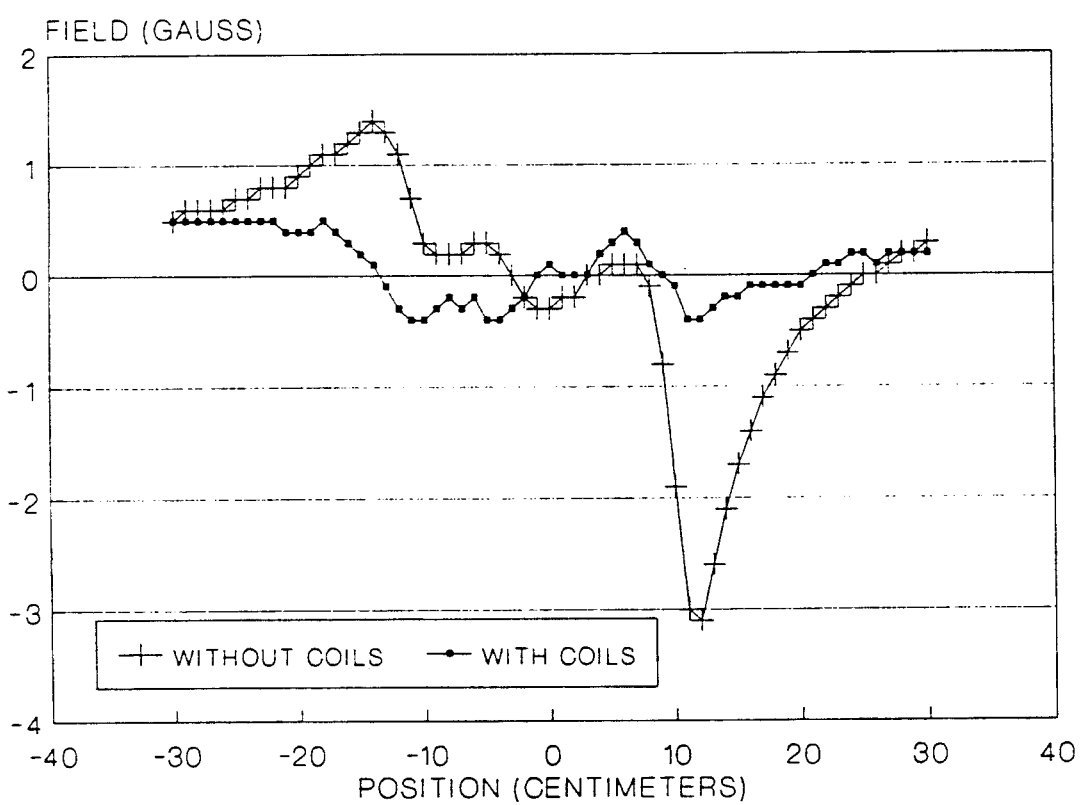
FIG. 3 is a graph showing the results of an experimental test of the invention in which the measured magnetic field exterior to a ferromagnetic shell is reduced by means of coils wrapped around the shell.

The results of one of the tests are shown in FIG. 3. In this test, a 50:1 scale model of an actual MRI installation was fabricated. Steel shim stock was used to construct the shell 10, and an array of permanent magnets was used to simulate the MRI magnet 20. The magnetic field distribution produced at scaled distances from the model magnet and shell agreed generally with the field distribution around the actual MRI installation. This was an important test because, in the actual MRI installation, the fringing field from the MRI magnet made the rooms on the adjacent floor, over the shield, unusable due to computer monitor display distortions.

The graph in FIG. 3 shows the magnetic field measurements made on the model along a line parallel to the longitudinal axis of the MRI magnet and 2 centimeters above the shell. This line corresponds to the second floor of the actual MRI site. The field exceeded 0.5 Gauss over a substantial area. To prevent distortion of computer monitor displays, the field must be reduced to 0.5 Gauss or lower. Four coils were then designed according to the method described hereinabove with reference to Eq. 2, and were added to the model shell to cancel the observed fields. Specifically, to cancel the field observed in the vicinity of $X=10$ centimeters, a coil with 40 turns and design current of 1.5 amps was wound around the shell at the location $X=10$. A 20-turn coil was placed at $X=-10$, and two 4-turn coils were placed at $X=+5$ and $X=-5$ centimeters to cancel the relatively weaker fields there. On the basis of Eq. 2, a current of 1.5 amps was expected to cancel these fields. The best cancellation was observed with a current of 1.6 amps, which produced the field distribution indicated by the curve labeled "With coils" in FIG. 3. As is evident in the graph, the field was reduced to 0.5 Gauss or lower everywhere in the region to be shielded.

Measurements in other regions of this model, and measurements using a similar model with permanent magnets substituted for coils, verify that a fringing magnetic field can be reduced effectively by placing shielding magnets between a ferromagnetic shell and the region to be shielded.

While the invention has been described with reference to specific embodiments, variations will be apparent to those skilled in the art in view of the above teachings. These descriptions are to be considered illustrative rather than limiting, the scope of the invention being defined in the appended claims.

I claim:

1. A device for shielding a selected region from magnetic fields produced by a magnetic field source, said device comprising a shell comprised of ferromagnetic material and at least one shielding magnet, said shell comprising a body that defines a boundary between the volume containing said selected region and the volume containing said magnetic field source, said at least one shielding magnet being provided on a surface of said shell between said shell and said selected region, and said at least one shielding magnet being oriented so as to produce a magnetic flux in said selected region generally opposite to said magnetic fields produced by said magnetic field source.

2. The device of claim 1 wherein said at least one shielding magnet is comprised of a permanently magnetized material.

3. The device of claim 1 wherein said at least one shielding magnet is comprised of electroconductive material carrying electrical current.

4. The device of claim 1 wherein said shell comprises a body that defines a substantially enclosed volume, said selected region of space being contained within said volume, and said magnetic field source being exterior to said volume.

5. The device of claim 1 wherein said shell comprises a body that defines a substantially enclosed volume, said magnetic field source being contained within said volume, and said selected region of space being exterior to said volume.

6. A method of producing a low magnetic field in a selected region proximate to a source of magnetic field, said method comprising the steps of:
    placing a shell comprised of ferromagnetic material so as to substantially separate the volume containing said selected region from the volume containing said source of magnetic field,
    measuring the magnetic field in said selected region,
    placing at least one shieldinng magnet in close proximity to said shell to substantially cancel said magnetic field in said selected region,
    and alternately measuring the magnetic field in said selected region and adjusting said at least one shielding magnet until said measurements indicate that a desired degree of magnetic field reduction has been achieved.

7. The method of claim 6 wherein said at least one shielding magnet is comprised of electroconductive material carrying electrical current.

8. The method of claim 7 wherein said at least one shielding magnet is adjusted by varying said electrical current.

9. The method of claim 6 wherein said at least one shielding magnet is comprised of permanently magnetized material.

10. The method of claim 9 wherein said at least one shielding magnet is adjusted by varying the magnetization of said permanently magnetized material.

11. The method of claim 6 wherein said at least one shielding magnet is adjusted by changing the location of said shielding magnet.

12. The method of claim 6 wherein said at least one shielding magnet is adjusted by changing the orientation of said shielding magnet relative to said shell.

13. A device for shielding a selected region from the external magnetic field of a MRI magnet, said device comprising a shell comprised of ferromagnetic material and defining a volume substantially enclosing said MRI magnet, said device further comrising at least one shielding magnet provided in close proximity to the exterior surface of said shell, said shielding magnet being interposed between said shell and said selected region, and said shielding magnet being oriented so as to generate in said selected region a magnetic flux generally opposite to said external magnetic field of said MRI magnet.

14. The device of claim 13 wherein said at least one shielding magnet is comprised of a permanently magnetized material.

15. The device of claim 13 wherein said at least one shielding magnet is comprised of electroconductive material carrying electrical current.

* * * * *